United States Patent [19]

Chen et al.

[11] Patent Number: 4,734,637
[45] Date of Patent: Mar. 29, 1988

[54] APPARATUS FOR MEASURING THE LENGTH OF AN ELECTRICAL LINE

[75] Inventors: Jiann-Neng Chen, Newton; Stephen A. Cohen, Andover, both of Mass.

[73] Assignee: Teradyne, Inc., Boston, Mass.

[21] Appl. No.: 852,842

[22] Filed: Apr. 16, 1986

[51] Int. Cl.$^4$ ...................... G01R 31/02; G01R 31/11
[52] U.S. Cl. ................. 324/58 R; 324/58 B; 324/58.5 B
[58] Field of Search .......... 324/58 B, 58.5 B; 331/99, 101

[56] References Cited

U.S. PATENT DOCUMENTS 3,842,370  10/1974  Fong ..................... 331/101
4,135,397   1/1979  Krake .................... 73/290

OTHER PUBLICATIONS

Hewlett Packard Application Note 174-10 for 5345 Electronic Counter.

*Primary Examiner*—A. D. Pellinen
*Assistant Examiner*—Leon K. Fuller

[57] ABSTRACT

Apparatus for precisely and quickly measuring the length of a line under test to an electrical discontinuity of the line, the apparatus including an edge generator for providing an edge to one end of the line, a reflection detector for detecting the edge reflection returning from the discontinuity to the one end and triggering the edge generator to provide an edge at a fixed time after detecting the edge reflection so as to cause the edge generator to repeatedly provide the edges at a frequency related to the propagation delay in the length of line, and a frequency measurer connected to measure the frequency.

28 Claims, 4 Drawing Figures

4,734,637

APPARATUS FOR MEASURING THE LENGTH OF AN ELECTRICAL LINE

FIELD OF THE INVENTION

The invention relates to measuring the length of an electrical line.

BACKGROUND OF THE INVENTION

Propagation delay in, or length of, an electrical line is typically measured by time domain reflectometry by providing an edge of a pulse to one end of a line (the other end of which is electrically open) by a driver, sensing when the edge has been applied to the line by sensing a first change in voltage at a detector connected to the same end of the line, and sensing the reflection back from the other end of the line by sensing a second change in voltage, the time between the two changes being twice the delay from the line. There are inaccuracies associated with detecting both changes in voltage, and in measuring such short nanosecond time intervals in general, and the results of numerous independent measurements are averaged to come up with a final measurement.

SUMMARY OF THE INVENTION

We have discovered that we can obtain quick and accurate time domain reflectometry measurements of electrical line length by providing an edge to an end of the line by an edge generator, detecting the reflection of the edge returning from a discontinuity (e.g., open end) at the end of the length of line, triggering the next edge at a fixed delay after detecting a reflected edge so as to cause the edge generator to repeatedly provide edges at a frequency related to the propagation delay of the line, and measuring the frequency at which the edges are provided. Because the generation of the edges and the detection of their reflections are dependent events, desired accuracy is obtained with fewer edge reflections than with the independent measurement technique described above.

In preferred embodiments, the reflected edges are detected by a voltage comparator that compares the voltage at the end of the line with that of a threshold voltage provided from a threshold generator; the edge generator alternately provides rising and falling edges; the threshold generator switches between a high threshold voltage used to detect a rising edge reflection and a low threshold voltage used to detect a falling edge reflection; the threshold generator is connected to the output of the voltage comparator to be switched to provide a high threshold after detecting a falling edge reflection and to provide a low threshold after detecting a rising edge reflection; the threshold generator includes a differential driver having true and complement outputs connected to a node via different resistances in a voltage divider; the edge generator provides a rising edge after the voltage comparator detects a falling edge reflection and provides a falling edge after the voltage comparator detects a rising edge reflection; delay lines are provided between the voltage comparator and the edge generator; two drivers are used in parallel in the edge generator to reduce impedance; and the edge generator's impedance is matched to that of the line under test. In some preferred embodiments the apparatus is incorporated within a multichannel tester to determine the delays through various paths through multiplexers connected to the multiple channels, and in some other preferred embodiments the apparatus is in a portable unit that can be connected to various electrical lines of different devices.

Other advantages and features of the invention will be apparent from the following description of preferred embodiments thereof and from the claims.

DESCRIPTION OF THE PREFERRED EMBODIMENTS

The drawings will be briefly described first.

Drawings

Structure

Figure 1:
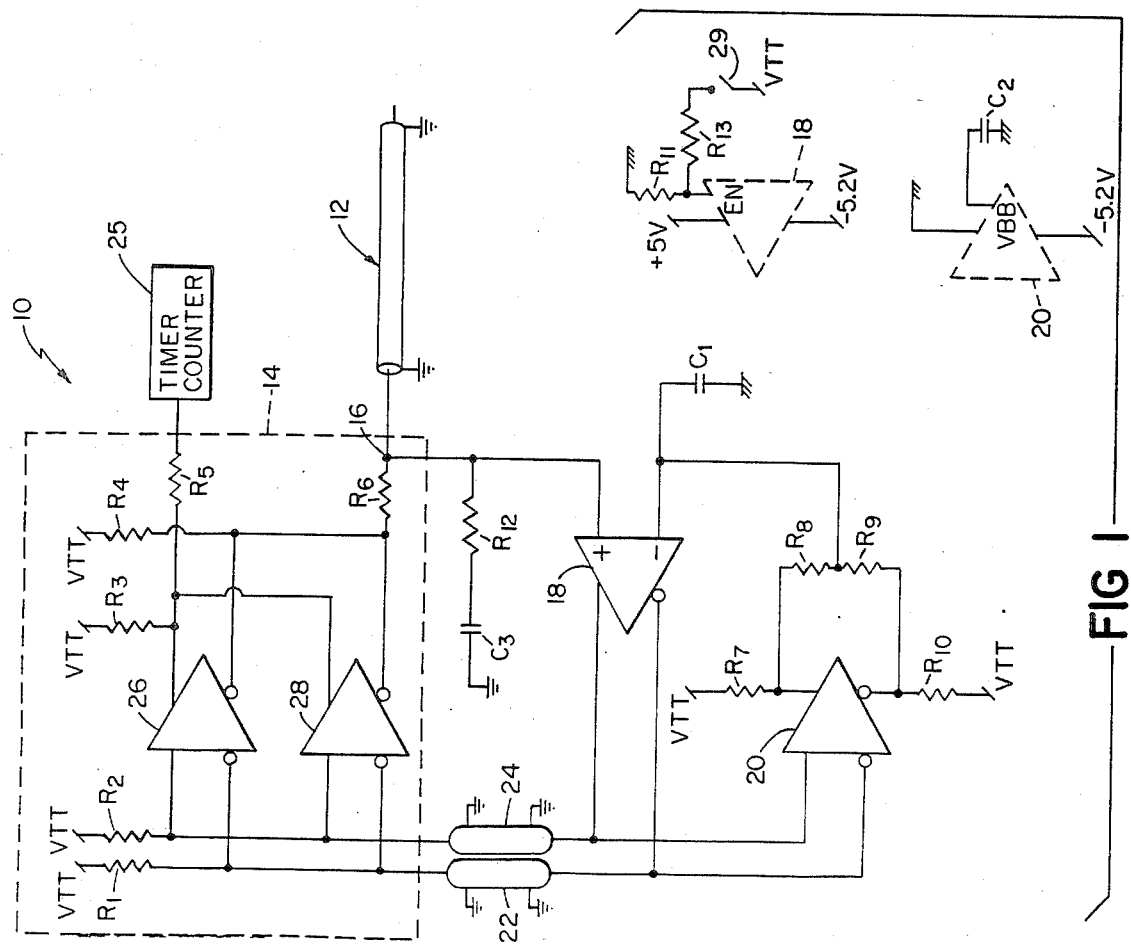
FIG. 1 is an electrical schematic of apparatus for measuring the length of an electrical line according to the invention.

Referring to FIG. 1, there is shown time domain reflectometry (TDR) measuring apparatus 10 connected to 50 ohm impedance electrical line under test 12. Device 10 includes edge generator 14 providing rising and falling edges to node 16, voltage comparator 18 (AM685), threshold generator 20 (ECL differential driver IOH116), delay lines 22, 24 (eight foot long 50 ohm coaxial cables), and timer-counter 25.

Edge generator 14 includes two 10H116 ECL differential drivers 26, 28 connected in parallel with their complement outputs connected to node 16 via 47 ohm back-match series resistor R6, which adds to the 3 ohm combined output resistance of drivers 26, 28 to give edge generator 14 a 50 ohm impedance, matched to that of cable 12. A matching network consisting of series connected 50 ohm resistor $R_{12}$ and capacitor $C_3$ cancels any output inductance in drivers 26, 28. The true outputs of drivers 26, 28 are connected via resistor R5 to timer-counter 25. Drivers 26, 28 are connected in parallel to have increased output current capability and lower output impedance. Their physical connections are arranged so there is equal propagation delay to and from drivers 26, 28 so that they act as a single circuit. Drivers 26, 28 and 20 are in the same physical package and thus have a close matching of input and output characteristics.

Node 16 is connected to the noninverting input to voltage comparator 18. The differential outputs of voltage comparator 18 are connected to differential delay lines 22, 24 and to threshold voltage generator 20. Resistors $R_{11}$, $R_{13}$ and normally open switch 29 provide means to momentarily halt the output to timer-counter 25 and line under test 12.

Threshold generator 20 has its true and complement outputs connected through voltage dividing resistors $R_8$, $R_9$ (300 ohms and 100 ohms, respectively) to the inverting input of comparator 18. The threshold values for comparator 20 are thus determined by the values of resistors $R_8$, $R_9$. Threshold level stabilizing capacitor $C_1$ is connected between the inverting input of comparator 18 and ground.

Resistors $R_1$, $R_2$ are 50 ohms; resistors $R_3$, $R_4$ are 68 ohms; resistors $R_7$, $R_{10}$ are 130 ohms; resistor $R_{11}$ is 100 ohms; capacitor $C_1$ is 20 pf; capacitor $C_2$ is 0.1 mf, capacitor $C_3$ is 2 pf, and VTT is $-2.4$ V. All circuit outputs are differential so that circuit noise is minimized.

Figure 2:
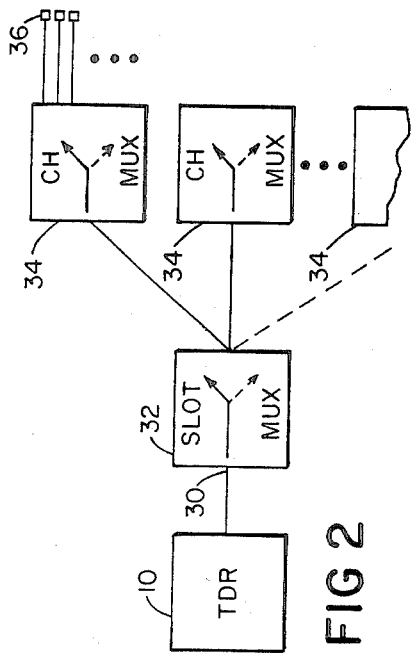
FIG. 2 is a block diagram showing the FIG. 1 apparatus connected to multiplexers of a multichannel tester.

Referring to FIG. 2, TDR line measuring apparatus 10 is shown connected to the common node 30 of 48:1 slot multiplexer 32 connected to forty-eight 12:1 channel multiplexers 34 connected to output nodes 36 of 576 driver/detectors of a multichannel tester in which the FIG. 2 components are incorporated. Slot multiplexer 32 and channel multiplexers 34 are used to selectively connect the 576 driver/detector nodes 36 one at a time to common node 30 during calibration of the 576 driver detectors. Apparatus 10 can thus be used to determine the actual delays through the various paths of slot multiplexer 32 and channel multiplexers 34 and to accommodate for them during calibration.

Figure 3:
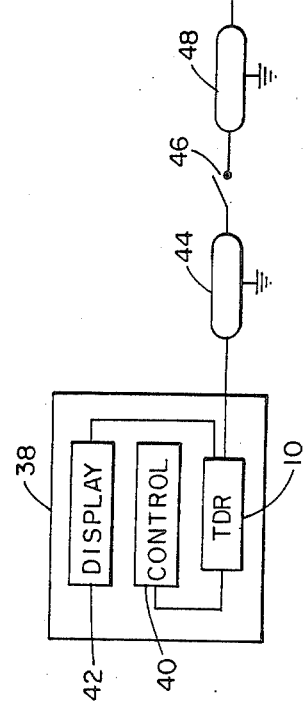
FIG. 3 is a block diagram of an alternative embodiment in which the FIG. 1 apparatus is designed for connection to various cables of different devices.

Referring to FIG. 3, TDR line measuring apparatus 10 is shown incorporated in portable TDR line measuring device 38, including control 40 and display 42 and connected via connecting cable 44 and switch 46 to an isolated line under test 48 of separate electrical apparatus.

Operation

In operation, node 16 of line measuring apparatus 10 is connected to line under test 12, which could be either one of the 576 paths between common node 30 and detector/driver nodes 36 through slot multiplexer 32 and channel multiplexer 34 (FIG. 2) or a line under test 48 of a separate electrical device (FIG. 3). Apparatus 10 can begin with the output of voltage comparator 18 in a low or a high level.

Assuming that comparator 18 (its true output) is initially in a low level or state, threshold generator 20 will similarly have a low level at its true output and a high level at its complement output. Owing to the voltage dividing effect of 300 ohm resistor $R_8$ and 100 ohm resistor $R_9$, this results in a threshold voltage applied to the inverting input of comparator 18 at $\frac{3}{4}$ the voltage level for a high state, as indicated by high threshold at 50 (dashed line) on FIG. 4.

With voltage comparator 18 in a low state, after a time delay through delay lines 22, 24, and the propagation delay through differential drivers 26, 28 of edge generator 14, their complement outputs switch from a low to a high state, providing a rising edge. Owing to the voltage divider effect between resistor R6 and the characteristic impedance of line under test 12, the resulting voltage level at node 16 ($V_{16}$, solid line on FIG. 4) initially rises to $\frac{1}{2}$ the voltage level between the high and low levels as shown at point 52 on FIG. 4.

When the rising edge propagating down line under test 12 encounters the discontinuity at its open end, it is reflected and propagates back toward node 16. Because the discontinuity for line 12 is an electrical open circuit, the reflected edge has the same polarity as the original edge.

Figure 4:
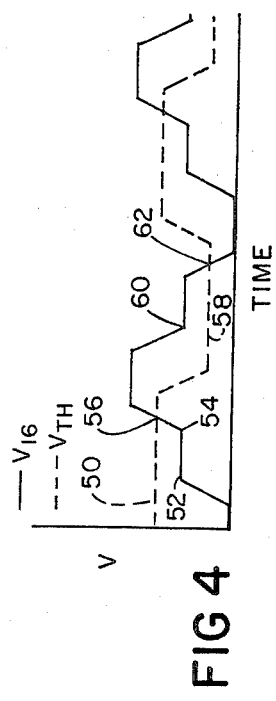
FIG. 4 is a graph showing both voltage at the end of the line under test and detector threshold voltage (ordinate) versus time (abscissa).

When the reflected edge arrives at node 16, at point 54 on FIG. 4, it adds to the existing voltage level, resulting in a full high level. The reflected edge is terminated because of the matched impedance of edge generator 14 and line 12 and the low input capacitance of comparator 18; there thus are no further reflections occurring owing to the original edge. When the reflected edge arrives at node 16 (also the noninverting input of voltage comparator 18), the output of comparator 18 changes state from a low to a high level because the voltage at the noninverting input passes the threshold (at a $\frac{3}{4}$ high level) as indicated at intersection 56 on FIG. 4. The high output of comparator 18 causes threshold generator 20 to produce a threshold voltage of $\frac{1}{4}$ the voltage level for a high state, owing to the reversal of its true and complement outputs and the voltage dividing effect of $R_8$ and $R_9$; this state is indicated by low threshold 58 (dashed line) on FIG. 4.

The delay provided by delay lines 22, 24 determines the time after comparator 18 has switched that edge generator 14 goes to the opposite state. This is necessary for the edge perturbations to dampen out at the comparator input before another comparison is made. After a time delay through delay lines 22, 24, the complement outputs of drivers 26, 28 produce a high to low edge that initially drives the voltage at node 16 to $\frac{1}{2}$ the voltage level between the high and low levels, again owing to the voltage divider effect mentioned earlier, as indicated at point 60 on FIG. 4. When the falling edge propagating in line 12 encounters the discontinuity at its open end, it is reflected back with the same polarity, and the voltage at node 16 falls to the full low level. At the same time, the output of voltage comparator 18 changes state to a low level, because the voltage at its noninverting input goes negative with respect to the low threshold voltage ($\frac{1}{4}$ level) at the inverting input, as is indicated at intersection 62.

The low level at the output of comparator 18 causes the cycle to repeat, as described above. The resulting cycle has a period proportional to the propagation delay of line under test 12; specifically, the period is proportional to four times the propagation delay in line 12 plus a fixed offset resulting from delay lines 22, 24 and the delays of comparator 18 and drivers 26, 28. The frequency of oscillation is determined by timer-counter 25.

A simple timer-counter can be used, because it is merely measuring the frequency or period of a repetitive digital signal. High quality time interval measurement devices of the type used when sensing both the original edge and the reflected edge are not needed. Because the output signal is a frequency, error due to random noise is inherently reduced by 1/N where N is the number of periods measured by timer-counter 25, resulting in a short measurement time. The averaging of independent time intervals with the prior TDR technique would require $N^2$ time intervals (and separate measurements) to achieve the same accuracy. Apparatus 10 resists distortion in line measurements owing to slightly different impedances in 50 ohm lines 12, because the high and low threshold voltages are set at the 50% points, where the slew rates (voltage/time) of drivers 26, 28 are highest and also where voltage comparator 18 has the greatest resistance to noise. Another advantage is that because only the reflected edges are detected, and not the original and the reflected edges as in the prior designs, delay in detecting the reflected edge, but not the original edge, caused by high driver slew rates and the effect of limited band width of the line under test does not cause a significant problem. Between measurements of different lines 12, switch 29 is momentarily closed after a new line 12 has been established, to cause any reflections to die out.

When the apparatus is used in the FIG. 2 multichannel tester, the 576 paths through slot multiplexer 32 and channel multiplexers 34 are separately connected to TDR measuring apparatus 10. The delay for an individual path to a given channel node 36 is used in synchronizing the channel with other channels by a method including establishing a path through the multiplexers to a common sychronizing circuit.

When portable TDR line measuring device 38 (FIG. 3) is used, the period of oscillation with switch 32 open is subtracted from the period with switch 32 closed and divided by four to get the propagation delay of line under test 48.

OTHER EMBODIMENTS

Other embodiments of the invention are within the scope of the following claims. For example, if TDR line measuring apparatus is to be used to measure a line with a different impedence, for example 75 ohms or 100 ohms, the impedance of edge generator 16 can be easily matched to that of the line by using a 72 ohm or 97 ohm resistor $R_6$.

What is claimed is:

1. Apparatus for precisely and quickly measuring the length of a line under test to an electrical discontinuity of said line, said apparatus comprising
   an edge generator for providing an edge to one end of said line,
   a reflection detector for detecting the edge reflection returning from said discontinuity to said one end and triggering said edge generator to provide an edge at a fixed time after detecting said edge reflection so as to cause said edge generator to repeatedly provide said edges at a frequency related to the propagation delay in said length of line, and
   a frequency measurer connected to measure said frequency.

2. The apparatus of claim 1 wherein said reflection detector comprises a threshold generator that provides a threshold voltage and a voltage comparator that compares voltage at said one end to said threshold voltage.

3. The apparatus of claim 2 wherein said edge generator alternately provides rising and falling edges.

4. The apparatus of claim 3 wherein said threshold generator switches said threshold voltage between a high threshold used to detect a rising edge reflection and a low threshold used to detect a falling edge reflection.

5. The apparatus of claim 4 wherein said threshold generator is connected to the output of said voltage comparator to be switched to provide said high threshold after said voltage comparator detects a falling edge reflection and to provide said low threshold after said voltage comparator detects a rising edge reflection.

6. The apparatus of claim 4 wherein said threshold generator includes a differential driver having true and complement outputs connected to a node via different resistances, so that said high threshold is provided at said node when the high driver output voltage is provided to the smaller resistance and the low output driver voltage is provided to the higher resistance, and said low threshold is provided to said node when the low output driver voltage is provided to the smaller resistance and the high output driver voltage is provided to the larger resistance.

7. The apparatus of claim 3 wherein said edge generator provides a rising edge after said voltage comparator detects a falling edge reflection and provides a falling edge after said voltage comparator detects a rising edge reflection.

8. The apparatus of claim 2 wherein said voltage comparator provides a differential output.

9. The apparatus of claim 8 wherein the differential output of said voltage comparator is provided through differential delay lines to said edge generator.

10. The apparatus of claim 1 wherein said edge generator has an impedance matched to that of said line under test.

11. The apparatus of claim 1 wherein said edge generator comprises two drivers connected in parallel and a resistor connected in series with the drivers and selected to provide an impedance matched to that of said line under test.

12. The apparatus of claim 4 wherein said high and low thresholds correspond to the high slew rate regions of edges provided by said edge generator.

13. The apparatus of claim 12 wherein said thresholds are at $\frac{1}{4}$ and $\frac{3}{4}$ the high levels of said edge generator.

14. The apparatus of claim 6 further comprising a stabilizing capacitor connected to the inverting input of said voltage comparator.

15. A multiple channel tester including the apparatus of claim 1 and a multiplexer having plural output nodes connected to output nodes of driver/detector channels and a common node connected to said edge generator, said line under test being a path through said multiplexer to a said output node.

16. The apparatus of claim 1 further comprising a display and wherein said apparatus is contained in a portable unit including means to connect said edge generator to various electrical lines of different devices.

17. A method of precisely and quickly measuring the length of a line under test to an electrical discontinuity of said line, said method comprising
   providing an edge to one end of said line by an edge generator,
   detecting the edge reflection returning from said discontinuity to said one end,
   triggering said edge generator to provide an edge at a fixed time after detecting said edge reflection so as to cause said edge generator to repeatedly provide said edges at a frequency related to the propagation delay in said length of line, and
   measuring said frequency.

18. The method of claim 17 wherein said detecting comprises comparing voltage at said one end to a threshold voltage.

19. The method of claim 18 wherein said providing an edge comprises alternately providing rising and falling edges.

20. The method of claim 19 wherein said threshold voltage is switched between a high threshold used to detect a rising edge reflection and a low threshold used to detect a falling edge reflection.

21. The method of claim 20 wherein said electrical discontinuity is an open end, and said high threshold is provided after detecting a falling edge reflection and said low threshold is provided after detecting a rising edge reflection.

22. The method of claim 20 wherein said high and low thresholds are provided by a threshold generator including a differential driver having true and complement outputs connected to a node via different resistances, so that said high threshold is provided at said node when the high driver output voltage is provided to a smaller resistance and the low output driver voltage is provided to a higher resistance, and said low threshold is provided to said node when the low output driver voltage is provided to the smaller resistance and the high output driver voltage is provided to the larger resistance.

23. The method of claim 19 wherein said electrical discontinuity is an open end, and a rising edge is provided after a falling edge reflection is detected, and a falling edge is provided after a rising edge is detected.

24. The method of claim 18 wherein said comparison is performed by a differential output voltage comparator, and the differential output of said voltage comparator is provided through differential delay lines to said edge generator.

25. The method of claim 17 wherein said edge generator has an impedance matched to that of said line under test.

26. The method of claim 25 wherein said edge generator comprises two drivers connected in parallel and a resistor connected in series with the drivers and selected to provide an impedance matched to that of said line under test.

27. The method of claim 20 wherein said high and low thresholds correspond to the high slew rate regions of said edges provided by said edge generator.

28. The method of claim 27 wherein said thresholds are at ¼ and ¾ the high levels of said edge generator.

* * * * *